United States Patent
Liu

(10) Patent No.: US 11,360,349 B2
(45) Date of Patent: Jun. 14, 2022

(54) DISPLAY EQUIPMENT AND METHOD FOR MANUFACTURING DISPLAY EQUIPMENT

(71) Applicant: BEIJING XIAOMI MOBILE SOFTWARE CO., LTD., Beijing (CN)

(72) Inventor: Zhaonan Liu, Beijing (CN)

(73) Assignee: Beijing Xiaomi Mobile Software Co., Ltd., Beijing (CN)

( * ) Notice: Subject to any disclaimer, the term of this patent is extended or adjusted under 35 U.S.C. 154(b) by 0 days.

(21) Appl. No.: 17/214,138

(22) Filed: Mar. 26, 2021

(65) Prior Publication Data

US 2021/0397042 A1 Dec. 23, 2021

(30) Foreign Application Priority Data

Jun. 23, 2020 (CN) .......................... 202010583683.3

(51) Int. Cl.
*G02F 1/1335* (2006.01)
*G02F 1/1333* (2006.01)
*H01L 51/52* (2006.01)
*H01L 51/56* (2006.01)

(52) U.S. Cl.
CPC .. *G02F 1/133528* (2013.01); *G02F 1/133308* (2013.01); *G02F 1/133512* (2013.01); *H01L 51/5284* (2013.01); *H01L 51/5293* (2013.01); *H01L 51/56* (2013.01)

(58) Field of Classification Search
CPC ..................... G02F 1/133317; G02F 1/133528
See application file for complete search history.

(56) References Cited

U.S. PATENT DOCUMENTS

| | | | |
|---|---|---|---|
| 2012/0262907 A1 | 10/2012 | Lee | |
| 2012/0281383 A1 | 11/2012 | Hwang | |
| 2014/0043560 A1 | 2/2014 | Jang | |
| 2014/0176849 A1 | 6/2014 | Lee | |
| 2015/0168640 A1 | 6/2015 | Jeong | |
| 2015/0177548 A1* | 6/2015 | Jeon | G02F 1/133308 349/12 |
| 2018/0088394 A1* | 3/2018 | Notoshi | G02F 1/133528 |
| 2018/0120498 A1 | 5/2018 | Tanaka et al. | |
| 2019/0204661 A1 | 7/2019 | Moon et al. | |
| 2020/0285097 A1* | 9/2020 | Zhang | G02B 6/0088 |

FOREIGN PATENT DOCUMENTS

| | | |
|---|---|---|
| CN | 106383414 A | 2/2017 |
| CN | 110824750 A | 2/2020 |
| JP | 2017120432 A | 7/2017 |
| JP | 2019101434 A | 6/2019 |

OTHER PUBLICATIONS

Extended European Search Report in the European Application No. 21165480.1, dated Sep. 9, 2021, (11p).
First Office Action of the Japanese application No. 2021-048214, dated Feb. 21, 2022, (14 pages).

* cited by examiner

*Primary Examiner* — Mariceli Santiago
(74) *Attorney, Agent, or Firm* — Arch & Lake LLP

(57) ABSTRACT

The display equipment includes: a housing, including a backplane and a side wall perpendicular to the backplane; a display component, placed parallel to the backplane, and covering the backplane and the side wall of the housing; and a fixing component, located between the backplane and the display component, and fixing the housing to the display component.

8 Claims, 8 Drawing Sheets

S100, the display component is fixed to the housing using the fixing component. The display component covers the fixing component, the backplane of the housing, and the side wall of the housing. The backplane of the housing is perpendicular to the side wall of the housing

FIG. 7

DISPLAY EQUIPMENT AND METHOD FOR MANUFACTURING DISPLAY EQUIPMENT

CROSS-REFERENCE TO RELATED APPLICATIONS

This application is based on and claims the priority to Chinese Application No. 202010583683.3 filed on Jun. 23, 2020. The entire content of the Chinese Application is hereby incorporated by reference in its entirety for all purposes.

BACKGROUND

With continuous development of display devices and ever-increasing demands of users, television equipment and smart phones, for example, move towards a high screen-to-body ratio, with an increasing user demand for narrow-border display devices and even borderless display devices.

There is a wide border surrounding a display surface on a display device, which limits increase in the screen-to-body ratio of the display device, and it is difficult to meet the user demand for narrow-border or even borderless display devices. In addition, a border is generally made of rigid material, and a wide border will also limit the extent to which the display may bend, thereby hindering development of curved screen technology.

SUMMARY

The present disclosure provides display equipment and a method for manufacturing display equipment.

According to an aspect of examples of the present disclosure, display equipment is provided, and includes:

a housing, including a backplane and a side wall perpendicular to the backplane;

a display component, placed parallel to the backplane, and covering the backplane and the side wall of the housing; and a fixing component, located between the backplane and the display component, and fixing the housing to the display component.

According to an aspect of examples of the present disclosure, a method for manufacturing display equipment is provided. The method may include providing a housing of the display equipment that comprises a backplane and a side wall perpendicular to the backplane; providing a display component of the display equipment that is placed parallel to the backplane to cover the backplane and the side wall of the housing; and providing a fixing component of the display equipment that is located between the backplane and the display component to fix the housing to the display component, and fixing the display component to the housing using the fixing component, wherein the display component covers the fixing component, the backplane of the housing, and the side wall of the housing, the backplane being perpendicular to the side wall.

It should be understood that the general description above and the elaboration below are exemplary and explanatory only, and do not limit the present disclosure.

BRIEF DESCRIPTION OF THE DRAWINGS

The accompanying drawings, which are incorporated in and constitute a part of this specification, illustrate examples consistent with the disclosure and, together with the description, serve to explain the principles of the disclosure.

FIG. 7 is a flowchart of a method for manufacturing display equipment in accordance with an example of the present disclosure.

DETAILED DESCRIPTION

Figure 1:
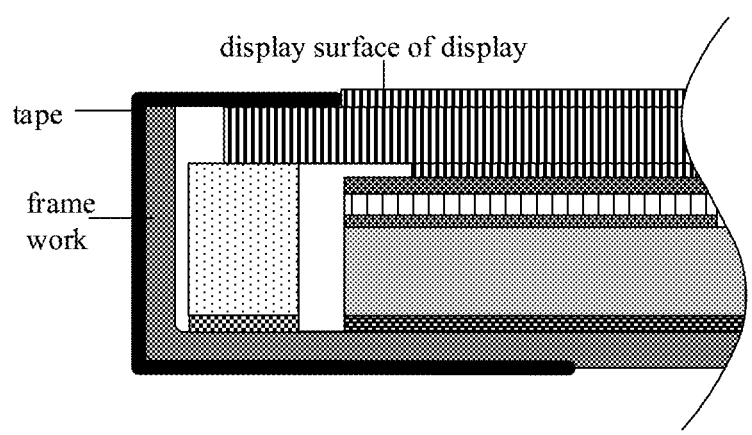
FIG. 1 is a schematic diagram showing a display device in accordance with an example of the present disclosure.

Reference will now be made in detail to examples, examples of which are illustrated in the accompanying drawings. The following description refers to the accompanying drawings in which the same numbers in different drawings represent the same or similar elements unless otherwise represented. The implementations set forth in the following description of examples do not represent all implementations consistent with the disclosure. Instead, they are merely examples of devices and methods consistent with aspects related to the disclosure. The exemplary implementation modes may take on multiple forms, and should not be taken as being limited to examples illustrated herein. Instead, by providing such implementation modes, examples herein may become more comprehensive and complete, and comprehensive concept of the exemplary implementation modes may be delivered to those skilled in the art. Implementations set forth in the following examples do not represent all implementations in accordance with the subject disclosure. Rather, they are merely examples of the apparatus and method.

Note that although a term such as first, second, third may be adopted in an example herein to describe various kinds of information, such information should not be limited to such a term. Such a term is merely for distinguishing information of the same type. For example, without departing from the scope of the examples herein, the first information may also be referred to as the second information. Similarly, the second information may also be referred to as the first information. Depending on the context, a "if" as used herein may be interpreted as "when" or "while" or "in response to determining that".

In addition, described characteristics, structures or features may be combined in one or more implementation modes in any proper manner. In the following descriptions, many details are provided to allow a full understanding of examples herein. However, those skilled in the art will know that the technical solutions of examples herein may be carried out without one or more of the details; alternatively, another method, component, device, option, etc., may be adopted. Under other conditions, no detail of a known structure, method, device, implementation, material or operation may be shown or described to avoid obscuring aspects of examples herein.

A block diagram shown in the accompanying drawings may be a functional entity which may not necessarily correspond to a physically or logically independent entity. Such a functional entity may be implemented in form of software, in one or more hardware modules or integrated circuits, or in different networks and/or processor devices and/or microcontroller devices.

A terminal may sometimes be referred to as a smart terminal. The terminal may be a mobile terminal. The terminal may also be referred to as User Equipment (UE), a Mobile Station (MS), etc. A terminal may be equipment or a chip provided therein that provides a user with a voice and/or data connection, such as handheld equipment, onboard equipment, etc., with a wireless connection function. Examples of a terminal may include a mobile phone, a tablet computer, a notebook computer, a palm computer, a Mobile Internet Device (MID), wearable equipment, Virtual Reality (VR) equipment, Augmented Reality (AR) equipment, a wireless terminal in industrial control, a wireless terminal in unmanned drive, a wireless terminal in remote surgery, a wireless terminal in a smart grid, a wireless terminal in transportation safety, a wireless terminal in smart city, a wireless terminal in smart home, etc.

FIG. 1 is a schematic diagram showing a part of a display device in accordance with an example of the present disclosure. As shown in FIG. 1, to install a display, the display and a framework are bonded together using a tape. Generally, the thickness of the display is small, for example, only 0.2 mm to 0.4 mm. Therefore, the tape has to wrap to the display surface (visible surface) of the display to ensure the width of bonding of the tape with the display, thereby improving tightness of fixation between the display and the framework.

When a user may directly see the tape wrapping the display surface of the display, since the tape and the display surface of the display are made of different materials, this will lower consistency in appearance of the display device, impacting texture of the display device, unfavorable for improving user experience.

Since tape-related surface processing fails to meet a requirement on an appearance part, the tape wrapping the display surface of the display may also be masked by placing a cover glass or a plastic appearance part parallel to the display surface of the display. However, the covering cover glass or plastic appearance part will increase the overall thickness and weight of the display device, which is unfavorable for thinning and portability of the display device, and will also increase the cost of the display device.

In an implementation, in order to ensure tightness of fixation between the display and the framework by the tape, the tape wrapping on the display surface of the display has a large width, so that a user observes a wide border surrounding the display surface of the display, unfavorable for reducing the width of the border of the display device. It is understandable that the width of the border surrounding the display surface of the display as observed by the user is equal to or slightly greater than the width of the tape wrapping on the display surface of the display.

Figure 2:
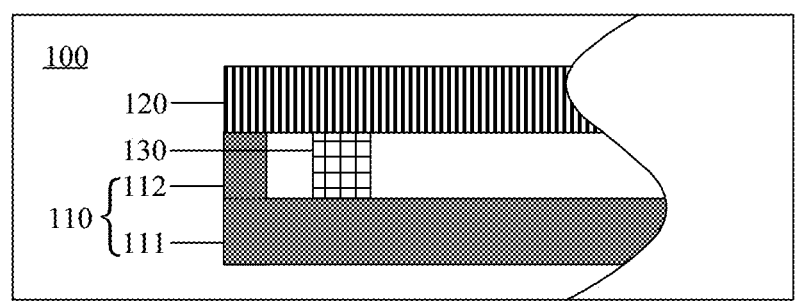
FIG. 2 is a schematic diagram showing a part of display equipment in accordance with an example of the present disclosure.

FIG. 2 is a schematic diagram showing display equipment 100 in accordance with an example of the present disclosure. Referring to FIG. 2, the display equipment 100 includes:

a housing 110, including a backplane 111 and a side wall 112 perpendicular to the backplane 111;

a display component 120, placed parallel to the backplane 111, and covering the backplane 111 and the side wall 112 of the housing 110; and a fixing component 130, located between the backplane 111 and the display component 120, and fixing the housing 110 to the display component 120.

By covering, it means that the backplane 111 and the side wall 112 are located in a projection area of a side of the display component 120 parallel to the backplane 111.

In an implementation, the display component 120 may cover the backplane 111 and the side wall 112 of the housing 110 as follows. The display component 120 may be arranged on the side of the side wall 112 away from the backplane 111. The display component 120 can cover the side of the side wall 112 in contact with the display component 120, and cover the side of the backplane 111 parallel (and close) to the display element 120.

The display equipment 100 may include: a mobile phones, a computer, a digital broadcasting terminal, messaging equipment, tablet equipment, medical equipment, fitness equipment, smart home equipment, etc.

The housing 110 may include: a housing surrounding the display equipment 100 and exposed outside, or a framework carrying the display component 120 and hidden inside the display equipment 100. Taking the display equipment 100 being a mobile phone as an example, the housing 110 may include a back shell or a middle frame.

The housing 110 may be made of material including: metal, alloy, plastic, or ceramic, etc.

The display component 120 is configured to display information. It may be understood that the display surface of the display component 120 faces away from the backplane 111.

The display component 120 includes: a Liquid Crystal Display (LCD) or an Organic Light-Emitting Diode (OLED) display, etc.

The side wall 112, the backplane 111 of the housing 110, and the display component 120 may enclose an accommodation space, and the fixing component 130 may be set in the accommodation space.

The fixing component 130 may be attached to the back surface of the display component 120. The back surface of the display component 120 is parallel to the display surface of the display component 120.

As shown in FIG. 2, the fixing component 130 may be fixedly connected to the backplane 111 to fix the housing 110 to the display component 120.

Figure 3:
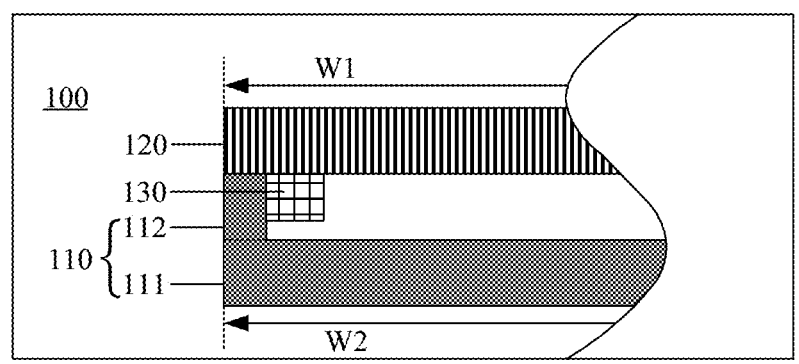
FIG. 3 is a schematic diagram showing a part of display equipment in accordance with an example of the present disclosure.

Alternatively, referring to FIG. 3, the fixing component 130 may be fixedly connected to the side wall 112 to fix the housing 110 to the display component 120. In this case, the fixing component 130 is not in contact with the backplane 111.

Alternatively, the fixing component 130 may be fixedly connected to both the backplane 111 and the side wall 112.

It should be pointed out that the dotted line in FIG. 2 is only for distinguishing the area where the backplane 111 is located from the area where the side wall 112 is located, and does not mean that there is a clear interface between the backplane 111 and the side wall 112 of the housing 110. The side wall 112 and the backplane 111 may be an integral structure, and the side wall 112 and the backplane 111 may be made of the same material.

In some examples, referring to FIG. 3, in a cross section of the display equipment parallel to a preset plane, along a direction parallel to the display component, the display component 120 has a first width (W1), the backplane 111 has a second width (W2), and the first width is equal to the second width. The preset plane is perpendicular to the display component 120 and the side wall 112.

Exemplarily, the display component 120 covers the side wall 112. The edge of the display component 120 may be aligned with the outer edge of the side wall 112. In this way, when a user faces the display equipment 100 from the display surface of the display component 120, the backplane 111 and the side wall 112 of the housing 110 are all hidden on the back of the display component 120, achieving a borderless effect. It may be understood that the outer edge of the side wall 112 is the edge of the side wall 112 facing the external environment, in other words, the outer edge of the side wall is a side facing away from the space accommodating the fixing component 130.

In some examples, the first width of the display component 120 is less than the second width of the backplane 111. The display component 120 only covers a part of the area of the side wall 112. When a user faces the display equipment 100 from the display surface of the display component 120, a certain area of the side wall 112 is exposed. The exposed area of the side wall 112 may be regarded as the border of the display equipment 100. It should be pointed out that since the fixing component 130 may fix the backplane 111 to the display component 120, the width of the exposed area of the side wall 112 is small, which helps reduce the border width of the display equipment 100 and improve user experience.

It should be pointed out that when the edge of the display component 120 exceeds the outer edge of the side wall 112, the part of the display component 120 that exceeds the outer edge of the side wall 112 protrudes toward the external environment. The side wall 112 does not support the part of the display component 120 protruding toward the external environment very well. Consequently, the display component 120 is prone to damage under a force such as a collision, which is unfavorable for ensuring quality of the display equipment 100. Therefore, the edge of the display component 120 does not exceed the outer edge of the side wall 112.

In examples of the present disclosure, the backplane 111 is fixed to the display component 120 using the fixing component 130 set between the backplane 111 of the housing 110 and the display component 120, ensuring fixation between the display component 120 and the backplane 111, without the need to set any tape wrapping to the display surface of the display component 120 to fix the display component 120 to the housing 110. The display component 120 may be fixed to the housing 110 while reducing mask to the display surface of the display component 120, which helps reduce the width of the border of the display surface of the display component 120.

In addition, with examples of the present disclosure, the backplane 111 is fixed to the display component 120 using the fixing component 130 set between the backplane 111 of the housing 110 and the display component 120, and the display component 120 covers the backplane 111 of the housing 110 and the side wall 112 of the housing 110. When a user faces the display surface of the display component 120, the width of the border of the display surface of the display component 120 observed by the user may be reduced, and even the housing 110 may be completely hidden behind the display component 120 so that the user will not observe the housing 110, and the user will not observe any border surrounding the display surface of the display equipment 100, achieving a borderless effect, improving user experience.

Figure 4:
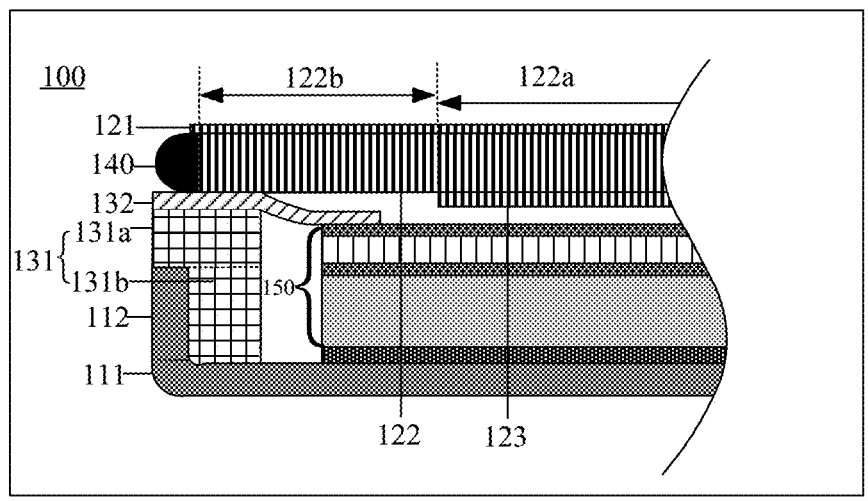
FIG. 4 is a schematic diagram showing a part of display equipment in accordance with an example of the present disclosure.

In some examples, as shown in FIG. 4, the display component 120 includes: a first polarizer 121, a display panel 122, and a second polarizer 123 that are stacked. A direction of polarization of the first polarizer 121 is different from a direction of polarization of the second polarizer 123.

The display panel 122 includes a display area 122a and a non-display area 122b located in a periphery of the display area.

The first polarizer 121 is located on an exit surface of the display panel 122 and covers the display area 122a and the non-display area 122b.

The second polarizer 123 is located on the display area 122a of an incident surface of the display panel 122.

When the display component 120 is an LCD, the incident surface of the display panel 122 faces the exit surface of the backlight component. The second polarizer 123 is set between the display area 122a of the incident surface of the display component 120 and the exit surface of the backlight component. The direction of polarization of the first polarizer 121 and the direction of polarization of the second polarizer 123 are both parallel to the display panel 122. The direction of polarization of the first polarizer 121 may be perpendicular to the direction of polarization of the second polarizer 123.

It should be pointed out that when the display component 120 is an OLED display, the display equipment 100 does not include a backlight component, and the display panel 122 emits light through an OLED to perform display. Therefore, the incident surface of the display panel 122 only represents a surface in the display panel 122 that is parallel to the exit surface of the display panel 122. The exit surface of the display panel 122 is the surface facing the user.

The display panel 122 may include a touch panel. The display area 122a may also include an active area (AA) of the touch panel.

It should be pointed out that the non-display area 122b cannot display content, and the display area 122a has a shade black Mylar that intercepts light, etc. However, the display area 122a and the non-display area 122b in the display panel 122 are an integral structure. When the display area 122a is not performing display, the non-display area 122b and the display area 122a observed by a user may present the same black opaque state.

In a direction parallel to the plane where the display panel 122 is located, the area of the first polarizer 121 may be slightly greater than the area of the display panel 122, and the area of the second polarizer 123 is less than the area of the display panel 122. It should be pointed out that the first polarizer 121 is in contact with the display surface of the display panel 122.

The projection of the first polarizer 121 onto the plane where the display panel 122 is located covers the display area 122a and the non-display area 122b. The projection of the second polarizer 123 onto the plane where the display panel 122 is located coincides with the display area 122a of the display panel 122.

In examples of the present disclosure, by providing the first polarizer 121 covering the display area 122a and the non-display area 122b of the display panel 122, when a user faces the display equipment 100 from the display surface of the display equipment 100, what the user sees is an integral first polarizer 121, and the housing 110 may be hidden on the back of the display component 120, so that the user will not observe the housing 110. In this way, the user will not observe the housing 110 of the display equipment 100, which reduces the area on the display surface of the display panel 122 that is occupied by the housing 110, thereby allowing the display equipment 100 to present a borderless effect.

In some examples, the display equipment 100 further includes a first shade layer located between the first polarizer 121 and the non-display area 122b.

The first shade layer may be made of material including dark light-absorbing material, such as black light-absorbing material.

The first shade layer may be made of material including: a mylar, a shade tape, or a shade ink, etc.

The first shade layer may be formed on the surface of the first polarizer 121 close to the display panel 122. Alternatively, the first shade layer may be formed on the surface of the non-display area 122b.

By providing the first shade layer between the first polarizer 121 and the non-display area 122b, the light leakage phenomenon occurred in the display component 120 may be reduced, and light in the external environment may also be blocked from entering the display panel 122 through the non-display area 122b, ensuring a good display effect of the display panel 122.

In some examples, the first shade layer may be a plastic layer with certain flexibility. In this way, the first shade layer may be deformed by being squeezed through an assembly operation during installation, thereby filling the gap between the first polarizer 121 and the non-display area 122b of the display panel 122, thereby preventing light leakage.

In some examples, referring to FIG. 4, the display equipment 100 further includes:

a protective structure 140 covering a side surface of the display panel 122. The side surface of the display panel 122 refers to a surface connecting the incident surface of the display panel 122 to the exit surface of the display panel 122.

The protective structure 140 is configured to block a substance in the external environment from contacting the side surface of the display panel 122, thereby ensuring that the structure of the display panel 122 will not be damaged by the substance in the external environment, ensuring a good display effect of the display equipment 100.

The protective structure 140 may be made of material including one meeting a requirement on an appearance part. In this way, the protective structure 140 will not adversely impact appearance and texture of the display equipment 100.

The protective structure 140 may be made of material including a sealant, etc.

Referring to FIG. 4, the edge of the first polarizer 121 may also be in contact with the protective structure 140. In this way, the first polarizer 121 and the protective structure 140 may block the contact between the external environment and the display panel 122, ensuring a good display effect of the display equipment 100.

As shown in conjunction with FIG. 4, the protective structure 140 has an arc-shaped surface protruding toward the outside of the housing 110. It should be pointed out that although a user may observe the arc-shaped surface when the user faces the display surface of the display panel 122, since the display component is fixed to the housing using the fixing component 130 in the present disclosure, the width of the arc-shaped surface observed by the user is small, and may be less than the width of the border observed by a user on the display surface of the display equipment. Therefore, the display equipment 100 provided by examples of the present disclosure may reduce the width of the border of the display surface of the display equipment 100, improving user experience.

In some examples, the display equipment 100 further includes: a second shade layer located between the protective structure and the side surface of the display panel 122.

The second shade layer may be made of material including dark light-absorbing material, such as black light-absorbing material, etc.

The second shade layer may be made of material including: a mylar, a shade tape, or a shade ink, etc.

The second shade layer may be formed on the surface of the protective structure 140 close to the side surface of the display panel 122. Alternatively, the second shade layer may be formed on the side surface of the display panel 122.

By providing the second shade layer between the protective structure 140 and the side surface of the display panel 122, the light leakage phenomenon occurred in the display component 120 may be reduced, and light in the external environment may also be blocked from entering the display panel 122 through the side surface of the display panel 122, ensuring a good display effect of the display component 120.

In some examples, the second shade layer may be a plastic layer with certain flexibility. In this way, the second shade layer may be deformed by being squeezed through an assembly operation during installation, and the deformed second shade layer may fill the gap between the display panel 122 and the side wall 112 or the backplane 111, thereby preventing light leakage.

In some examples, the protective structure 140 may further be made of material including a shade material. In this way, the side surface of the display panel 122 may be shaded without the need to provide an additional second shade layer.

In some examples, referring to FIG. 4, the fixing component 130 includes:

a plastic part 131, the plastic part 131 having a boss 131a covering a top of the side wall 112, the boss 131a being located between the housing 110 and the display panel 122; and a first adhesive layer 132 bonding the boss 131a and the display panel 122 together.

It should be pointed out that the dotted line in the plastic part 131 in FIG. 4 only for indicating the area where the boss is located, and does not mean that there is an interface at the dotted line in the plastic part 131.

The first adhesive layer 132 may be made of material such as double-sided adhesive, thermal curing adhesive, or ultraviolet curing adhesive, etc.

The first adhesive layer 132 may be transparent, or the first adhesive layer may also be a shade layer.

In examples of the present disclosure, by providing the boss 131a, given a constant thickness of the display equipment 10, the thickness of the side wall 112 of the housing 110 may be increased by reducing the thickness of the boss 131a, improving the mechanical strength of the housing 110, thereby improving the mechanical strength of the display equipment 100.

In addition, the first adhesive layer 132 provided in this example may bond the plastic part 131 and the display component 120 together, so that the plastic part 131 and the display component 120 form a conjoined structure, which restricts relative movement between the plastic part 131 and the display component 120, which is a simple process with low process cost, and high compatibility with other implementations.

In some examples, as shown in FIG. 4, the plastic part 131 further includes: a supporting part 131b connected to the boss 131a.

The supporting part 131b may be parallel to the side wall 112.

It should be pointed out that the boss 131a and the supporting part 131b are an integral structure.

Exemplarily, as shown in conjunction with FIG. 4, the edge of the supporting part 131b may be in contact with the side wall 112.

Alternatively, the edge of the supporting part 131b may be bonded to the side wall 112, so that the plastic part 131 and the side wall 112 form a conjoined structure, so as to improve tightness of connection between the plastic part 131 and the housing.

Alternatively, the bottom of the supporting part 131b may be in contact with the backplane 111. The top of the supporting part 131b may be connected to the boss 131a. The top and the bottom of the supporting part 131b may be opposite surfaces. By providing the supporting part 131b, it may play a supporting role between the boss 131a and the backplane 111, which helps improve the mechanical strength of the display equipment.

In some examples, an outer edge of the boss 131a, an outer edge of the side wall 112, and an outer edge of the first adhesive layer 132 are aligned.

It should be pointed out that the outer edge of the boss 131a is the edge of the boss 131a facing the external environment. The outer edge of the side wall 112 is the edge of the side wall 112 facing the external environment. The outer edge of the first adhesive layer 132 is the edge of the first adhesive layer 132 facing the external environment.

Alternatively, the outer edge of the boss 131a, the outer edge of the side wall 112, and the outer edge of the first adhesive layer 132 may form a rounded surface with a curvature. Taking the display equipment 100 being a mobile phone as an example, when the rounded surface is the shell of the mobile phone, it helps improve comfort of the user holding the display equipment 100 in hand.

In some examples, the display equipment 100 further includes:

a backlight component 150 fixed on the backplane 111 and located between the display component 120 and the backplane 111.

A width of the first adhesive layer may be greater than a width of the boss. A part of the first adhesive layer exceeding the boss may adhere to the backlight component. In other words, the first adhesive layer is bonded respectively to the backlight component, the boss, and the display component 120.

The backlight component 150 may be configured to provide backlight to the display component 120.

The backlight component 150 may include a backlight source. The backlight source may be set facing the incident surface of the display panel 122. The backlight source may include: an array of Light-Emitting Diodes (LED) or an array of OLED, etc. It should be pointed out that the incident surface of the display panel 122 is the incident surface of the display component 120.

By bonding the backlight component 150 using the part of the first adhesive layer 132 that extends beyond the boss 131a, the backlight component 150 and the display component 120 may form a conjoined structure through the first adhesive layer 132. Since the backlight component 150 is fixed on the backplane 111, the relative displacement between the display component 120 and the housing 110 may be restricted by the conjoined structure, which improves fixation of the display component 120, ensuring quality of the display equipment 100.

Figure 5:
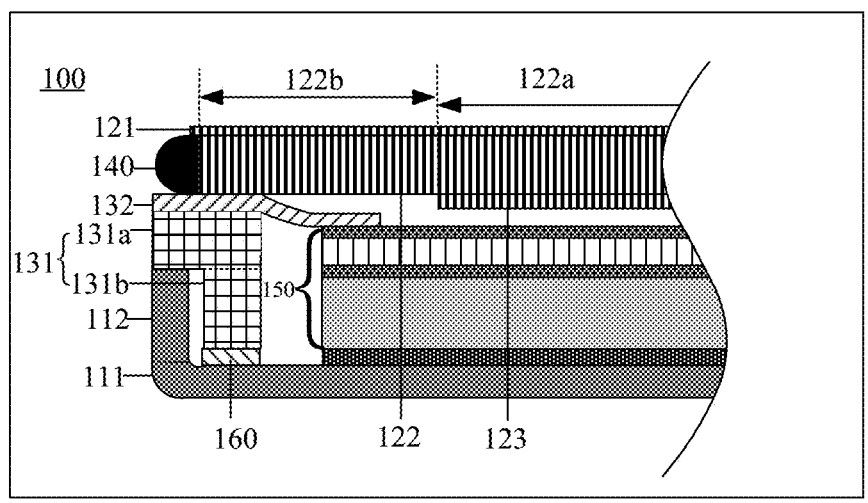
FIG. 5 is a schematic diagram showing a part of display equipment in accordance with an example of the present disclosure.

In some examples, referring to FIG. 5, the fixing component 130 further includes a fixing structure 160 that fixes the plastic part 131 to the housing 110.

The fixing structure 160 may include: a second adhesive layer that bonds the plastic part 131 and the housing 110 together. The second adhesive layer may be made of material such as double-sided adhesive, thermal curing adhesive, or ultraviolet curing adhesive, etc.

The second adhesive layer may be located between the bottom of the plastic part 131 and the backplane 111. The second adhesive layer may be formed between the bottom of the plastic part 131 and the backplane 111 by dispensing glue, and the plastic part 131 and the backplane 111 may be bonded together using the second adhesive layer. It should be pointed out that the second adhesive layer fixes the backplane 111 to the fixing component 130 and restricts the relative movement between the fixing component 130 and the housing 110.

The second adhesive layer may also be located between the side surface of the plastic part 131 and the side wall 112. It may be understood that when a second adhesive layer is also formed between the side surface of the plastic part 131 and the side wall 112, the second adhesive layer may fill the gap between the side surface of the plastic part 131 and the side wall 112.

The second adhesive layer may be made of material such as double-sided adhesive, thermal curing adhesive, or ultraviolet curing adhesive, etc.

Figure 6:
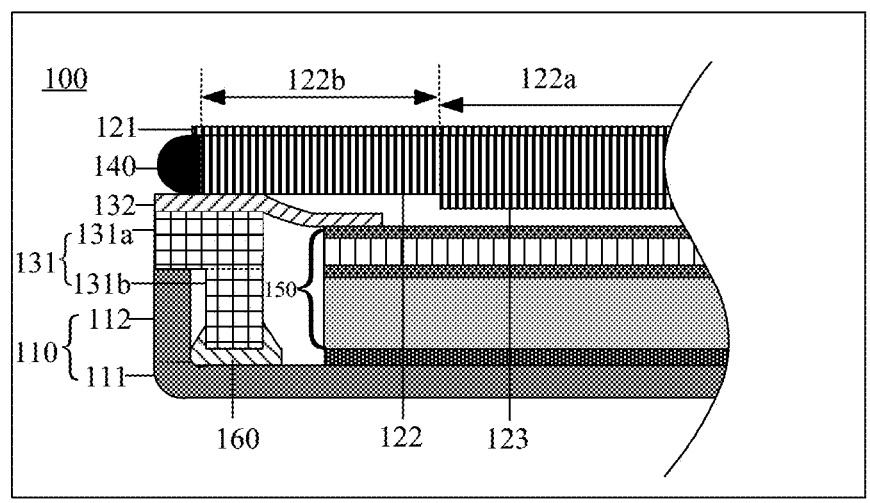
FIG. 6 is a schematic diagram showing a part of display equipment in accordance with an example of the present disclosure.

Alternatively, referring to FIG. 6, the fixing structure 160 may include: a groove matching the size of the bottom of the plastic part 131 and a hook contacting the side surface of the supporting part 131b. The fixing structure 160 and the housing 110 may be an integral structure formed by integral injection molding. It may be understood that when the fixing structure includes the hook, there is a gap between the supporting part 131b and the side wall 112.

The fixing structure 160 provided in this example may fix the plastic part 131 to the housing 110, so that the plastic part 131 and the housing 110 form a conjoined structure, which restricts relative movement between the plastic part 131 and the housing 110, which is a simple process with low process cost, and high compatibility with other implementations.

In some examples, the plastic part 131 and the housing 110 are an integral structure. Flexibility of the plastic part 131 may be greater than flexibility of the housing 110.

The housing 110 may be made of material including a rigid material, such as metal or ceramic, etc.

It should be pointed out that although the plastic part 131 and the housing 110 are an integral structure, the plastic part 131 and the housing 110 are still two parts that implement different functions. In addition, for the integral structure composed of the plastic part 131 and the housing 110, there is no relative movement between the plastic part 131 and the housing 110.

The plastic part 131 and the housing 110 may be formed by insert molding. The plastic part 131 and the housing 110 may be made of different material.

In examples of the present disclosure, by adopting the integral structure of the plastic part 131 and the housing 110, compared to the conjoined structure formed by fixing the separate housing 110 and plastic part 131, tightness of connection between the plastic part 131 and the housing 110 may be improved, thereby improving tightness of connection between the display component 120 and the integral structure, reducing the probability of relative displacement between the display component 120 and the integral structure, ensuring mechanical stability of the display equipment 100.

Moreover, by integrating the plastic part 131 and the housing 110 into an integral structure, process steps for assembling the display equipment 100 may be reduced, improving production efficiency.

In an implementation, by integrating the plastic part 131 and the housing 110 into an integral structure, there is no need to provide an additional area for carrying the plastic part 131 in the housing 110, and the thickness of the gap between the plastic part 131 and the housing 110 is reduced, which helps reduce the thickness of the display equipment 100, thereby achieving lighter and thinner display equipment 100.

In addition, by adopting the housing 110 that is less flexible than the plastic part 131, the overall mechanical strength of the display equipment 100 may be improved. By using a more flexible plastic part 131, the plastic part 131 may play a buffering role between the display component 120 and the housing 110, reducing the probability of damage to the display component 120 due to a collision, etc., helping ensure quality of the display equipment 100.

FIG. 7 is a flowchart of a method for manufacturing display equipment in accordance with an example of the present disclosure. The display equipment is the display equipment 100 provided in examples of the present disclosure. Referring to FIG. 7, the method may include a step as follows.

In S100, the display component is fixed to the housing using the fixing component. The display component covers the fixing component, the backplane of the housing, and the side wall of the housing. The backplane of the housing is perpendicular to the side wall of the housing.

With examples of the present disclosure, the display component is fixed to the housing using the fixing component, without the need to set any tape wrapping to the display surface of the display component to fix the display component to the housing. The display component may be fixed to the housing while reducing mask to the display surface of the display component, which helps reduce the width of the border of the display panel.

In addition, with examples of the present disclosure, the display component is provided to cover the fixing component, the backplane and the side wall of the housing. When the user faces the display surface of the display component, the housing may be hidden on the back of the display component, so that the user will not observe the housing, achieving a borderless effect, improving user experience.

In some examples, the display component includes: a display panel having a display area and a non-display area located in a periphery of the display area. The method may further include steps as follows:

forming a first shade layer covering the non-display area;

attaching a first polarizer to an exit surface of the display panel, the exit surface of the display panel being parallel to an incident surface of the display panel, the first shade layer being located between the first polarizer and the non-display area, the first polarizer covering the display area and the non-display area; and attaching a second polarizer to the display area of the incident surface of the display panel.

Exemplarily, the first shade layer covering the non-display area may be formed by pasting. Alternatively, the first shade layer may also be formed by coating.

Exemplarily, the first shade layer covering the non-display area may be formed by coating. Alternatively, the first shade layer may be attached to the non-display area by pasting.

In some examples, the method further includes: forming a first shade layer on the first polarizer.

It should be pointed out that when the first polarizer formed with the first shade layer is attached to the exit surface of the display panel, the first shade layer covers the non-display area.

In examples of the present disclosure, by providing the first shade layer between the first polarizer and the non-display area, the light leakage phenomenon occurred in the display component may be reduced, and light in the external environment may also be blocked from entering the display panel through the non-display area, ensuring a good display effect of the display panel.

In some examples, the method further includes: forming a protective structure on a side surface of the display panel. The side surface of the display panel may connect an incident surface of the display panel to an exist surface of the display panel. The exit surface of the display panel may be parallel to the incident surface of the display panel.

Exemplarily, the protective structure may be formed on the side surface of the display panel by dispensing glue. Alternatively, a protective structure covering the side surface of the display panel may be formed by coating.

By forming a protective structure covering the side surface of the display panel, the side surface of the display panel may be protected, reducing probability of damage to the display panel caused by collision or friction between the outside and the side surface of the display panel, which helps ensure quality of the display device.

In some examples, the method further includes: forming a fixing component and a housing that are an integral piece.

Exemplarily, the fixing component and the housing that are an integral piece may be formed by insert molding.

It should be pointed out that although the fixed component and the housing are an integral structure, the fixed component and the housing are still two parts that implement different functions. In addition, for the fixing component and the housing that are an integral piece, there is no relative movement between the fixed component and the housing.

Compared to the fixing component and the housing that are independent of each other, in this example, the fixing component and the housing are formed as an integral piece. The integral structure integrates the fixing component serving to fix the display component. When using the integral structure in the display equipment, no additional fixation of the fixing component and the housing is required, simplifying the structure and assembly process of the display equipment.

Figure 8:
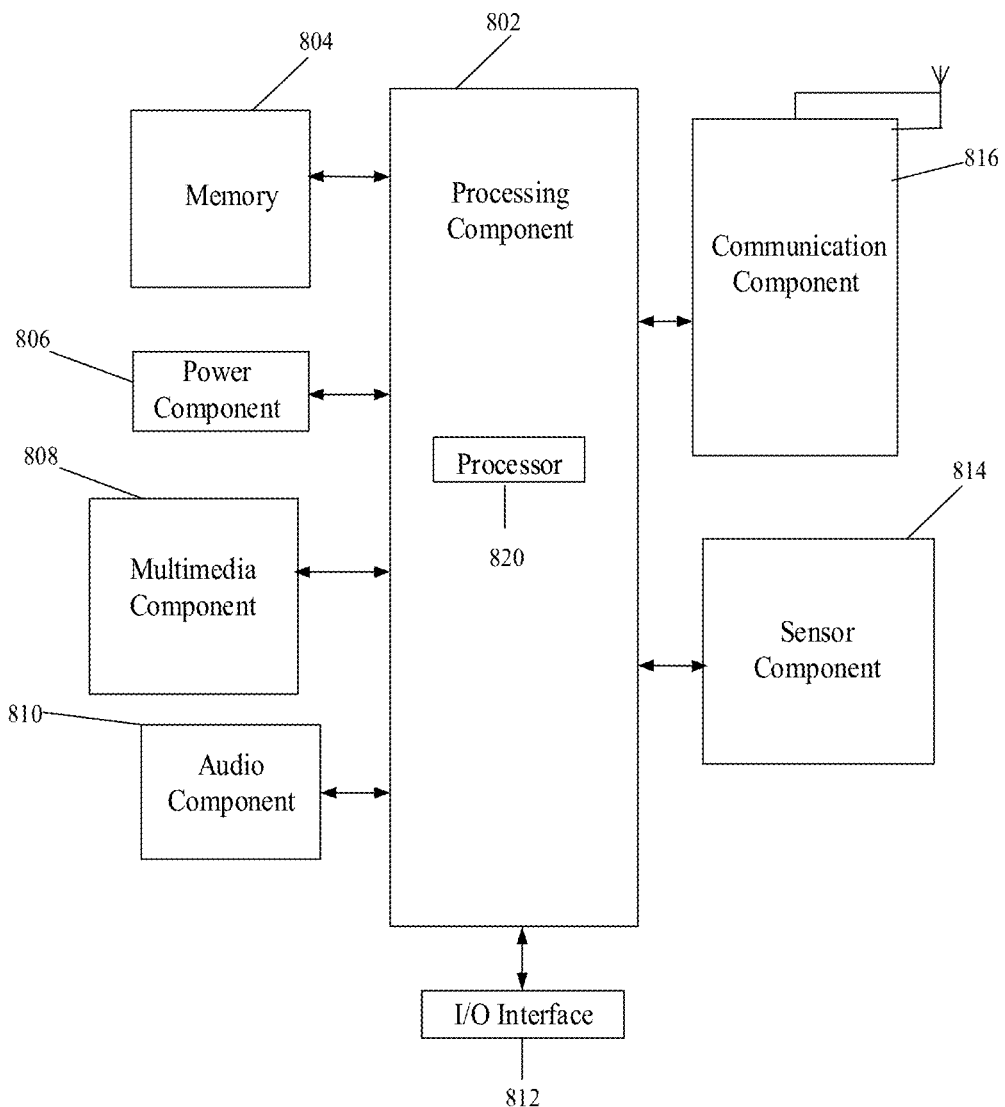
FIG. 8 is a block schematic diagram showing a display device in accordance with an example of the present disclosure.

FIG. 8 is a block schematic diagram showing a display device 800 in accordance with an example of the present disclosure. The device 800 includes a multimedia component 808. The multimedia component 808 includes the display equipment 100 provided in examples of the present disclosure. The device 800 may further include one or more of the following components: a processing component 802, a memory 804, a power component 806, an audio component 810, an input/output (I/O) interface 812, a sensor component 814, and a communication component 816.

The processing component 802 generally controls an overall operation of the display equipment, such as operations associated with display, a telephone call, data communication, a camera operation, a recording operation, etc. The processing component 802 may include one or more processors 820 to execute instructions so as to complete all or some steps of the method. In addition, the processing component 802 may include one or more modules to facilitate interaction between the processing component 802 and other components. For example, the processing component 802 may include a multimedia module to facilitate interaction between the multimedia component 808 and the processing component 802.

The memory 804 is configured to store various types of data to support operation on the device 800. Examples of these data include instructions of any application or method configured to operate on the device 800, contact data, phonebook data, messages, pictures, videos, and/or the like. The memory 804 may be realized by any type of volatile or non-volatile storage equipment or combination thereof, such as Static Random Access Memory (SRAM), Electrically Erasable Programmable Read-Only Memory (EEPROM), Erasable Programmable Read-Only Memory (EPROM), Programmable Read-Only Memory (PROM), Read-Only Memory (ROM), magnetic memory, flash memory, magnetic disk, or compact disk.

The power component 806 supplies electric power to various components of the device 800. The power component 806 may include a power management system, one or more power supplies, and other components related to generating, managing and distributing electric power for the device 800.

The multimedia component 808 includes a screen providing an output interface between the device 800 and a user. The screen may include a Liquid Crystal Display (LCD) and a Touch Panel (TP). If the screen includes a TP, the screen may be realized as a touch screen to receive an input signal from a user. The TP includes one or more touch sensors for sensing touch, slide and gestures on the TP. The touch sensors not only may sense the boundary of a touch or slide move, but also detect the duration and pressure related to the touch or slide move.

In some examples, the multimedia component 808 includes a front camera and/or a rear camera. When the device 800 is in an operation mode such as a shooting mode or a video mode, the front camera and/or the rear camera may receive external multimedia data. Each of the front camera and/or the rear camera may be a fixed optical lens system or may have a focal length and be capable of optical zooming.

The audio component 810 is configured to output and/or input an audio signal. For example, the audio component 810 includes a microphone (MIC). When the device 800 is in an operation mode such as a call mode, a recording mode, and a voice recognition mode, the MIC is configured to receive an external audio signal. The received audio signal may be stored in the memory 804 or may be sent via the communication component 816. In some examples, the audio component 810 further includes a loudspeaker configured to output the audio signal.

The I/O interface 812 provides an interface between the processing component 802 and a peripheral interface module. The peripheral interface module may be a keypad, a click wheel, a button or the like. These buttons may include but are not limited to: a homepage button, a volume button, a start button, and a lock button.

The sensor component 814 includes one or more sensors for assessing various states of the device 800. For example, the sensor component 814 may detect an on/off state of the device 800 and relative positioning of components such as the display and the keypad of the device 800. The sensor component 814 may further detect a change in the position of the device 800 or of a component of the device 800, whether there is contact between the device 800 and a user, the orientation or acceleration/deceleration of the device 800, and a change in the temperature of the device 800. The sensor component 814 may include a proximity sensor configured to detect existence of a nearby object without physical contact. The sensor component 814 may further include an optical sensor such as a Complementary Metal-Oxide-Semiconductor (CMOS) or Charge-Coupled-Device (CCD) image sensor used in an imaging application. In some examples, the sensor component 814 may further include an acceleration sensor, a gyroscope sensor, a magnetic sensor, a pressure sensor, or a temperature sensor.

The communication component 816 is configured to facilitate wired or wireless/radio communication between the device 800 and other equipment. The device 800 may access a radio network based on a communication standard such as WiFi, 2G, 3G, . . . , or a combination thereof. In an example, the communication component 816 broadcasts related information or receives a broadcast signal from an external broadcast management system via a broadcast channel. In an example, the communication component 816 further includes a Near Field Communication (NFC) module for short-range communication. For example, the NFC module may be realized based on Radio Frequency Identification (RFID), Infrared Data Association (IrDA), Ultra-WideBand (UWB) technology, BlueTooth (BT) technology, and other technologies.

Other examples of the disclosure will be apparent to those skilled in the art from consideration of the specification and practice of the disclosure disclosed here. This application is intended to cover any variations, uses, or adaptations of the disclosure following the general principles thereof and including such departures from the present disclosure as come within known or customary practice in the art. It is intended that the specification and examples be considered as exemplary only.

It will be appreciated that the present disclosure is not limited to the exact construction that has been described above and illustrated in the accompanying drawings, and that various modifications and changes can be made without departing from the scope thereof.

According to a first aspect of examples of the present disclosure, display equipment is provided, and includes:

a housing, including a backplane and a side wall perpendicular to the backplane;

a display component, placed parallel to the backplane, and covering the backplane and the side wall of the housing; and a fixing component, located between the backplane and the display component, and fixing the housing to the display component.

In some examples, the display component includes: a first polarizer, a display panel, and a second polarizer that are stacked. A direction of polarization of the first polarizer may be different from a direction of polarization of the second polarizer.

The display panel may include: a display area and a non-display area located in a periphery of the display area.

The first polarizer may be located on an exit surface of the display panel and cover the display area and the non-display area. The second polarizer may be located on the display area of an incident surface of the display panel.

In some examples, the fixing component includes:

a plastic part, the plastic part having a boss covering a top of the side wall, the boss being located between the housing and the display panel; and a first adhesive layer bonding the boss and the display panel together.

In some examples, the plastic part further includes: a supporting part connected to the boss.

The supporting part may be parallel to the side wall.

In some examples, an outer edge of the boss, an outer edge of the side wall, and an outer edge of the first adhesive layer are aligned.

In some examples, the display equipment further includes:

a backlight component fixed on the backplane and located between the display component and the backplane.

A width of the first adhesive layer may be greater than a width of the boss. A part of the first adhesive layer exceeding the boss may adhere to the backlight component.

In some examples, the plastic part and the housing are an integral structure. The flexibility of the plastic part may be greater than flexibility of the housing, Alternatively, the fixing component may further include a fixing structure that fixes the plastic part to the housing.

In some examples, the display equipment further includes:

a first shade layer located between the first polarizer and the non-display area.

In some examples, the display equipment further includes: a protective structure covering a side surface of the display panel.

The side surface of the display panel may connect the incident surface of the display panel to the exit surface of the display panel.

In some examples, the display equipment further includes:

a second shade layer located between the protective structure and the side surface of the display panel.

In some examples, in a cross section of the display equipment parallel to a preset plane, along a direction parallel to the display component, the display component has a first width, the backplane has a second width, and the first width is equal to the second width. The preset plane may be perpendicular to the display component and the side wall.

According to a second aspect of examples of the present disclosure, a method for manufacturing display equipment is provided. The display equipment is any display equipment according to the first aspect of examples of the present disclosure. The method includes: fixing the display component to the housing using the fixing component.

The display component covers the fixing component, the backplane of the housing, and the side wall of the housing. The backplane is perpendicular to the side wall.

In some examples, the display component includes: a display panel having a display area and a non-display area located in a periphery of the display area. The method may further include:

forming a first shade layer covering the non-display area;

attaching a first polarizer to an exit surface of the display panel, the exit surface of the display panel being parallel to an incident surface of the display panel, the first shade layer being located between the first polarizer and the non-display area, the first polarizer covering the display area and the non-display area; and attaching a second polarizer to the display area of the incident surface of the display panel.

In some examples, the method further includes: forming a protective structure on a side surface of the display panel. The side surface of the display panel may connect an incident surface of the display panel to an exist surface of the display panel. The exit surface of the display panel may be parallel to the incident surface of the display panel.

A technical solution provided by examples of the present disclosure may include beneficial effects as follows.

A housing is fixed to a display component using a fixing component set between a backplane of the housing and the display component, and the display component covers the backplane of the housing and the side wall of the housing. When a user faces the display surface of the display component, the width of the border of the display surface of the display component observed by the user may be reduced, reducing the width of the border. Alternatively, even the housing may be completely hidden behind the display component so that the user will not observe the housing, and the user will not observe any border surrounding the display surface of the display equipment, achieving a borderless effect, improving user experience.

The present disclosure may include dedicated hardware implementations such as application specific integrated circuits, programmable logic arrays and other hardware devices. The hardware implementations can be constructed to implement one or more of the methods described herein. Examples that may include the apparatus and systems of various implementations can broadly include a variety of electronic and computing systems. One or more examples described herein may implement functions using two or more specific interconnected hardware modules or devices with related control and data signals that can be communicated between and through the modules, or as portions of an application-specific integrated circuit. Accordingly, the system disclosed may encompass software, firmware, and hardware implementations. The terms "module," "sub-module," "circuit," "sub-circuit," "circuitry," "sub-circuitry," "unit," or "sub-unit" may include memory (shared, dedicated, or group) that stores code or instructions that can be executed by one or more processors. The module refers herein may include one or more circuit with or without stored code or instructions. The module or circuit may include one or more components that are connected.

In addition, examples of the present disclosure do not require setting a border on the display surface of the display component, which eliminates limitation imposed by a rigid border to development of curved screen technology, laying a foundation for development of curved screens, helping adapt to different application requirements.

What is claimed is:

1. Display equipment, comprising:
   a housing, comprising a backplane and a side wall perpendicular to the backplane;
   a display component, placed parallel to the backplane, and covering the backplane and the side wall of the housing; and
   a fixing component, located between the backplane and the display component, and fixing the housing to the display component,
   wherein the display component comprises: a first polarizer, a display panel, and a second polarizer, the first polarizer, the display panel, and the second polarizer being stacked, wherein a direction of polarization of the first polarizer is different from a direction of polarization of the second polarizer,
   wherein the display panel comprises: a display area and a non-display area located in a periphery of the display area,
   wherein the first polarizer is located on an exit surface of the display panel and covers the display area and the non-display area, wherein the second polarizer is located on the display area of an incident surface of the display panel, wherein the fixing component comprises:

a plastic part, the plastic part having a boss covering a top of the side wall, wherein the boss is located between the housing and the display panel; and a first adhesive layer bonding the boss and the display panel together, wherein an outer edge of the boss, an outer edge of the side wall, and an outer edge of the first adhesive layer are aligned.

2. The display equipment of claim 1, wherein the plastic part further comprises:

a supporting part connected to the boss, the supporting part being parallel to the side wall.

3. The display equipment of claim 1, wherein:

the plastic part and the housing are an integral structure, wherein flexibility of the plastic part is greater than flexibility of the housing, or, the fixing component further comprises a fixing structure, the fixing structure fixing the plastic part to the housing.

4. The display equipment of claim 1, further comprising:

a first shade layer located between the first polarizer and the non-display area.

5. The display equipment of claim 1, further comprising:

a protective structure covering a side surface of the display panel, wherein the side surface of the display panel connects the incident surface of the display panel to the exit surface of the display panel.

6. The display equipment of claim 5, further comprising:

a second shade layer located between the protective structure and the side surface of the display panel.

7. The display equipment of claim 1, wherein in a cross section of the display equipment parallel to a preset plane, along a direction parallel to the display component, the display component has a first width, the backplane has a second width, and the first width is equal to the second width, and the preset plane is perpendicular to the display component and the side wall.

8. Display equipment, comprising:

a housing, comprising a backplane and a side wall perpendicular to the backplane;

a display component, placed parallel to the backplane, and covering the backplane and the side wall of the housing; and a fixing component, located between the backplane and the display component, and fixing the housing to the display component, wherein the display component comprises: a first polarizer, a display panel, and a second polarizer, the first polarizer, the display panel, and the second polarizer being stacked, wherein a direction of polarization of the first polarizer is different from a direction of polarization of the second polarizer, wherein the display panel comprises: a display area and a non-display area located in a periphery of the display area, wherein the first polarizer is located on an exit surface of the display panel and covers the display area and the non-display area, wherein the second polarizer is located on the display area of an incident surface of the display panel, wherein the fixing component comprises:

a plastic part, the plastic part having a boss covering a top of the side wall, wherein the boss is located between the housing and the display panel; and a first adhesive layer bonding the boss and the display panel together, wherein the display equipment further comprises:

a backlight component fixed on the backplane and located between the display component and the backplane, wherein a width of the first adhesive layer is greater than a width of the boss, wherein a part of the first adhesive layer exceeding the boss adheres to the backlight component.

* * * * *